United States Patent [19]

Constant

[11] 4,006,351
[45] Feb. 1, 1977

[54] RECURSIVE FILTER IMPLEMENTED AS A MATCHED CLUTTER FILTER

[76] Inventor: James Nickolas Constant, 1603 Danbury Drive, Claremont, Calif. 91711

[22] Filed: Nov. 11, 1974

[21] Appl. No.: 522,718

[52] U.S. Cl. .............................................. 235/152
[51] Int. Cl.² ...................................... G06F 15/34
[58] Field of Search .................................... 235/152

[56] References Cited

UNITED STATES PATENTS 3,808,412  4/1974  Smith ................................. 235/152

OTHER PUBLICATIONS

McCracken, D. D., et al., *Numerical Methods and Fortran Programming*, N.Y., John Wiley and Sons, Inc., 1964, pp. 2–3.

*Primary Examiner*—R. Stephen Dildine, Jr.

[57] ABSTRACT

In a recursive (zeros and poles) filter having input and output signals $y$ and $y_o$ and having impulse response $h_r$ apparatus and method for obtaining the convolution $y_o = y * h_r$ using either the convolution integral or using the discrete Fourier transform (DFT). When using the convolution integral the apparatus first computes the impulse response $h_r$ then obtains the response $y_o$ in a convolver while when using the DFT the apparatus first computes the transfer function $H_r$ then obtains the frequency spectrum $Sy_o$ of response $y_o$. By implementing the recursive filter as a matched clutter filter, the error normally associated with this type filter is minimized.

21 Claims, 11 Drawing Figures

RECURSIVE FILTER IMPLEMENTED AS A MATCHED CLUTTER FILTER

BACKGROUND OF THE INVENTION

The present invention relates to signal processing using matched filters, correlators, convolvers, Fourier analyzers, inverse Fourier analyzers, and more particularly to signal processors which measure the impulse response $h$, the transfer function $H$, and coherence function $\gamma^2$ of two signals $y$ and $x$ in real time. The signals $y$ and $x$, for example, may be the received and transmitted signals in a radar, sonar, communication system, or the output and input of an amplifier, receiver, or even more complex device.

The Fourier transform F of signals $y$ and $x$ are given by $$S_y = F\{y\}$$
$$S_x = F\{x\} \quad (1)$$

from which three power spectra and corresponding time correlations may be computed. These are the cross and auto power spectra and correlations $$
\begin{aligned}
G_{yx} &= S_y S_x^* & R_{yx} &= F^{-1}\{G_{yx}\} \\
G_{yy} &= S_y S_y^* & R_{yy} &= F^{-1}\{G_{yy}\} \\
G_{xx} &= S_x S_x^* & R_{xx} &= F^{-1}\{G_{xx}\}
\end{aligned} \quad (2)
$$

where the asterisk indicates a complex conjugate and $F^{-1}$ is the inverse Fourier transform of the quantity indicated. The correlations and their Fourier transforms are given by $$
\begin{aligned}
R_{yx} &= \int y(t)\,x(t+\tau)\,dt & G_{yx} &= F\{R_{yx}\} \\
R_{yy} &= \int y(t)\,y(t+\tau)\,dt & G_{yy} &= F\{R_{yy}\} \\
R_{xx} &= \int x(t)\,x(t+\tau)\,dt & G_{xx} &= F\{R_{xx}\}
\end{aligned} \quad (3)
$$

Signal $x$ is related to the signal $y$ by the transfer function $H$ and impulse response $h$ $$H = \frac{S_y}{S_x} = \frac{G_{yx}}{G_{xx}} \qquad h = F^{-1}\{H\} \quad (4)$$

In the foregoing the impulse response $h$ and transfer function $H$ are equivalent statements in the time and frequency domains of the relationship between the signals $y$ and $x$ which may be considered as received and transmitted signals in a receiver or as outputs and inputs of a system under test. In some applications however, the measurement desired is not the relationship between signals but the causality between signals. This type measurement is obtained by computing the coherence function which is given by $$\gamma^2 = \frac{G_{yx}^2}{G_{yy}G_{xx}} \qquad \Gamma = F^{-1}\{\gamma\} \quad (5)$$

where $\gamma^2$ is a value lying between 0 and 1. In view of equations (4), equation (5) can also be written as follows $$\gamma^2 = \frac{H^2 G_{xx}}{G_{yy}} \qquad \Gamma = F^{-1}\{\gamma\} \quad (6)$$

which provides an alternative method for computing the coherence function.

It is a well known fact in the radar and communications arts that the output of a linear filter $S_{y_o}$ is related to its input $S_{y_o}$ by the filter transfer function $H_r$ $$S_{y_o} = S_y H_r = G_{yx} H_r' \quad (7)$$

where $S_{y_o}$ and $S_y$ represent the frequency spectra of the output signal $y_o$ and input signal $y$ respectively. The second part of equation (7) is obtained by multiplying and dividing the first part by $S_x^*$.

The output signal $y_o$ may be obtained using any one of the following algorithms $$
\begin{aligned}
y_o &= \int y(t)\,h_r(t-\tau)\,dt = \int R_{yx}(t)\,h_r'(t-\tau)\,dt \\
y_o &= F^{-1}\{S_y H_r\} = F^{-1}\{G_{yx} H_r'\} \\
y_o &= \int a(t)\,y(t-\tau)\,dt - \int b(t)\,y_o(t-\tau)\,dt
\end{aligned} \quad (8)
$$

where the integrals denote finite sums in practice. Thus the output of a filter can be obtained in one of a number of ways; by direct use of the convolution integral in the first of equations (8), by first using equation (7) to obtain the frequency spectrum $S_{y_o}$ and then using the inverse Fourier transform in the second of equations (8), or by using the difference equations in the last of equations (8).

A number of useful ways of designing filters are known in the present filter art including direct convolution, fast convolution, and recursive filtering. In direct convolution the filter is realized by computing the convolution integral, in fast convolution by using the fast Fourier transform (FET) or chirp-Z transform (CZT) to compute $S_{y_o}$ and then inverse transforming, and in recursive filtering by using linear difference equations. A given filter design can be obtained in a general purpose computer or using special purpose hardware. TABLE 1 is provided showing the number of operations which must be performed when implementing linear filters.

TABLE 1

| PROCESSOR TYPE | DIRECT CONVOLUTION | FAST CONVOLUTION | RECURSIVE FILTERING |
|---|---|---|---|
| SERIAL | $N^2$ | $N\log_2 N$ | NM |
| CASCADE | N | N | N |
| PARALLEL | N | $\log_2 N$ | M |
| ARRAY | 1 | 1 | 1 | where $N > M > N\log_2 N$ and designations for the processor type indicate the time sequence for performing the operations indicated in the table.

As indicated by TABLE 1 a serial processor performs $N^2$ operations in time sequence to obtain a direct convolution while fast convolution and recursive filtering reduce the number of operations by factors $\log_2 N/N$ and M/N respectively. If the operations are cascaded, paralleled, or arrayed fewer operations are needed and these are obtained in less time but with more software and/or hardware. Thus 1 array operation of an array processor produces the same result at $N^2$ serial operations in a serial processor to obtain a direct convolution. The execution time of the array processor is therefore the least but its complexity is the greatest since each operation in the array processor requires redundant software and/or hardware which is what is traded for speed. In practice software implementations of the fast convolution, and recursive filtering techniques and with cascading, paralleling, and arraying the operations, has resulted in considerable savings in execution times. As example, if the execution time of a general purpose computer is 1 millisecond/operation then the execution of a serial processor fast convolution is $Nlog_2N$ milliseconds and this becomes quite large even for modest values of N. Cascading, paralleling, and arraying computers quickly increases the cost. As a consequence, while the general purpose computer has the potential it falls short in many applications which require short execution times and in many other applications which require real time operation. Special purpose hardware is known in the present art having execution times on the order of 1 microsecond/operation and these are indicated for many applications where the processing must be accomplished in real time. FFT hardware has been discussed in the article by Bergland "FFT Transform Hardware Implementations-An Overview" appearing in the June 1969 issue of IEEE Transactions on Audio and Electroacoustics and in the article by Groginsky and Works "A Pipeline Fast Fourier Transform" appearing in the November 1970 issue of IEEE Transactions on Computers. Analog and digital filters are discussed in a number of publications including the article by Squire et al "Linear Signal Processing and Ultrasonic Transversal Filters" appearing in the November 1969 issue of IEEE Transactions on Microwave Theory and Techniques, in the book by Gold and Rader "Digital Processing of Signals" McGraw-Hill 1969, and in the book edited by Rabiner and Rader "Digital Signal Processing" IEEE Press 1972.

It is a well known fact in the present filter art that the number of operations in a filter grows with the number of zeros $r$ and poles $m$ in the filter. Furthermore it is known that non-recursive (zeros only) filters are easy to implement. Because their impulse responses are finite they can be implemented using the fast convolution with result that the number of operations grow only as $log_2 r$. The computational savings can be impressive when $r$ is large. While recursive (zeros and poles) filters too can be implemented using the fast convolution as well as recursive filtering their impulse response is infinite and they put severe conditions on their implementations with result that the number of operations grows at a rate much higher than $log_2 m$. As a consequence the computational savings for $m$ large are obtained less efficiently. This can all be seen in the article by Voelcker and Hartquist "Digital Filtering Via Block Recursion" appearing in the reference by Rabiner and Rader. Thus while the non-recursive filter obtains the growth rate $log_2 N$ ($r = N$) the recursive filter obtains the rate $M > log_2 N$ ($m = N$) as shown in TABLE 1. As a consequence while the general purpose computer and special purpose hardware have the potential they both fall short in many applications which require the implementation of a recursive type filter.

A filter is said to be matched when either transfer functions defined by equation (7) satisfy $$H_r = \frac{S_x^*}{|N|^2} \qquad h_r = F^{-1}\{H_r\}$$

$$H_r' = \frac{1}{|N|^2} \qquad h_r' = F^{-1}\{H_r'\} \qquad (9)$$

where $|N|^2$ is the power spectrum of the noise or clutter which interferes with the signal $y$ in the filter. The output of a matched filter is obtained by using equation (9) in equation (7)

$$S_{u_o} = \frac{G_{ux}}{|N|^2} \qquad y_o = F^{-1}\left\{\frac{G_{ux}}{|N|^2}\right\} \qquad (10)$$

Examples of matched filters may be obtained by specifying the power spectrum $|N|^2$ of the interference in equations (9) and (10); when $$\begin{aligned}
&|N|^2 = \text{constant}\\
&H_r = S_x^* \qquad H_r' = 1\\
&S_{u_o} = G_{ux}\\
&y_o = R_{ux}
\end{aligned} \qquad (11)$$

Thus when $|N|^2 =$ constant, for example thermal noise, the filter is matched for thermal noise when the transfer function $H_r$ is implemented as the complex conjugate $S_x^*$ of the signal $x$ and the filter output represents the cross correlation $R_{ux}$. This is the most familiar case encountered in practice and has been discussed in a number of publications, for example in chapter 9 in the book by Skolnik "Introduction to Radar Systems" McGraw-Hill 1962. Another important case arises when the interference resembles the signal itself, when $$|N|^2 = G_{xx}$$

$$H_r = \frac{S_x^*}{G_{xx}} = \frac{1}{S_x} = \frac{G_{ux}}{S_u G_{xx}} \qquad H_r' = \frac{1}{G_{xx}}$$

$$S_{u_o} = \frac{G_{ux}}{G_{xx}} = \frac{S_u}{S_x} = H$$

$$y_o = F^{-1}\{H\} = h \qquad (12)$$

Thus when $|N|^2 = G_{xx}$, the transfer function $H_r$ can be implemented in one of a number of ways as shown in the second of equations (12) and the filter output represents the impulse response $h$ of signals $y$ and $x$. This case has been discussed in a number of publications, for example in section 12.4 of Skolnik who describes a matched filter for clutter rejection and in the article by Roth "Effective Measurements using Digital Signal Analysis" appearing in the April 1971 issue of IEEE Spectrum. Yet another interesting case arises when the interference resembles the combination of signals, when $$|N|^2 = (G_{uu}G_{xx})^{1/2}$$

$$H_r = \frac{S_x^*}{(G_{uu}G_{xx})^{1/2}} \qquad H_r' = \frac{1}{(G_{uu}G_{xx})^{1/2}}$$

$$S_{u_o} = \frac{G_{ux}}{(G_{uu}G_{xx})^{1/2}} = \gamma$$

$$y_o = F^{-1}\{\gamma\} = \Gamma \qquad (13)$$

Thus when $|N|^2 = (G_{yy}G_{xx})^{1/2}$, the transfer function assumes the form shown in the second of equations (13) and the filter output represents the Fourier transform of the square root of the coherence function $\gamma^2$. This case has been described by Carter et al "The Smoothed Coherence Transform" appearing in the October 1973 issue of IEEE (Lett) Proceedings. In the present disclosure the term "matched filter" will be used to denote a matched filter for thermal noise for which $|N|^2$ = constant while the term "matched clutter filter" will denote a matched filter for clutter for which $|N|^2$ is a function of frequency.

From the foregoing it can be concluded, first, that once the nature of the interference is specified the matched filter is known, second, the filter can be implemented in any one of a number of ways using equations (8) and, third, the matched filter is a non-recursive (zeros only) type filter while the matched clutter filter is a recursive (zeros and poles) type filter. As a consequence, it is to be expected that the matched filter is a simple apparatus based on $R_{yx}$ and $G_{yx}$ while the matched clutter filter is a complex apparatus based on $h$ and $H$ or $\Gamma$ and $\gamma$.

The matched filter based on $R_{yx}$ and $G_{yx}$ is useful in many practical applications especially where there exists little or no interference except thermal noise and signal $y$ almost identically therefore resembles signal $x$. The matched clutter filter based on $h$ and $H$ is useful when the interference resembles signal $x$ and signal $y$ is a complex signal, for example a group or plurality of closely spaced overlapping signals each signal in the group being almost identical to signal $x$. The matched clutter filter based on $\Gamma$ and $\gamma$ is useful when the interference resembles the product of signals $y$ and $x$, for example when both signals $y$ and $x$ have been mixed.

The problem at hand is to obtain a better measurement of the time delay and frequency relationships of signals $y$ and $x$ in a clutter environment. Such measurements are needed in applications involving the arrival of multiple closely spaced and overlapping signals $y$ following transmission of a signal $x$, for example in radar, sonar, and communications applications and in applications involving the frequency response of a system under test, for example a communication line, an amplifier and so forth. In such applications the measurement of the impulse response $h$ and its transfer function H $$h = \int \frac{G_{yx}}{G_{xx}} e^{j\omega t} d\omega \qquad H = F\{h\} \qquad (14)$$

have better time resolution and frequency response than the cross correlation $R_{yx}$ and its power spectrum $G_{yx}$ $$R_{yx} = \int G_{yx} e^{j\omega t} d\omega \qquad G_{yx} = F\{R_{yx}\} \qquad (15)$$

The better measurements afforded by equation (14) over equation (15) are obtained by dividing the cross power spectrum $G_{yx}$ by the auto power spectrum $G_{xx}$ or, alternatively in view of equation (4), by dividing the frequency spectrum $S_y$ by the frequency spectrum $S_x$. This is the problem discussed both by Skolnik and Roth. It has also been suggested ad hoc by Carter et al that an even better result is obtained by dividing the cross power spectrum $G_{yx}$ by the square root of the product of auto correlations $(G_{yy}G_{xx})^{1/2}$. As discussed previously, the whitening process of dividing the cross power spectrum $G_{yx}$ by the power spectrum $|N|^2$ of the interference results in a matched filter for the particular type of interference which is being specified in the matching.

The benefits which are to be derived from the measurement of the impulse response $h$, transfer function H, and coherence function $\gamma^2$ are threefold; first, it becomes possible to unambiguously determine the time delay between signals even though the signals may have complex shapes or forms, components, codings, close arrival spacings of components and overlappings, second, it becomes possible to accurately determine the performance of a system under test, and third, it becomes possible to determine the effect of noise. To achieve these three important situations the present art proceeds in a certain sequence of steps; first it obtains the transfer function $H_r$ of the filter in one of three canonical forms (direct, cascade, parallel) then obtains the filter architecture. Unfortunately however the procedure is limited since the system errors, especially the input quantization and transfer function quantization errors, impose severe restrictions upon the physical implementations of the filter, which for the particular case of a filter with a large number of poles results in a highly inefficient and uneconomic apparatus in the present art. As will become apparent during the course of the disclosure the present invention overcomes these serious deficiencies in the present filter art by implementing the recursive filter as a matched clutter filter. In general, computations of the convolution integral can be made using general purpose computers or using special purpose hardware with the latter offering significant savings in computational speeds and costs in a large number of applications. However, while the design of a matched filter involves the relatively simple problem of designing a filter having no poles and only zeros, the corresponding design of a matched clutter filter involves the increasingly difficult problem of designing a filter having both poles and zeros and this reflects directly in the weight, size, power consumption, and cost of both the software and hardware which may be used. Matched clutter filters are therefore more complex and costly devices when compared to simple matched filters and for this reason are not generally available for mass consumption and use. In fact the design of a matched clutter filter for real time operation becomes almost prohibitive since a large amount of paralleling of elemental hardare building blocks becomes necessary in order to achieve the desired speedup of the signal processing throughput. This can all be seen in the article by Bergland.

From the foregoing it is clear that making the needed computations using special purpose hardware offers the potential benefit of high speed processing but while this is easily said it is not easily done. The fact is that recursive filters are complex and costly devices and have not found extensive use in practice. Thus while the present art has the potential it has failed to provide simple and economic apparatus and method for implementing recursive filters, for example for computing the impulse response $h$, transfer function H, and coherence function $\gamma^2$.

What is important in the decision to implement a matched clutter filter is the accuracy and ambiguity which can be tolerated in the desired result. As example, many applications can be satisfied with a simple matched filter comprising a single correlator and a single Fourier analyzer to obtain the cross correlation $R_{y,x}$ and cross power spectrum $G_{y,x}$ from which the relationship between signals $y$ and $x$ may be obtained to within some low but tolerable accuracy and ambiguity. If higher accuracy and less ambiguity are desired in the application then a complex matched filter must be implemented comprising perhaps a number of correlators and Fourier analyzers to obtain the impulse response $h$ and transfer function H. In practical terms the desire for higher accuracy and less ambiguity requires the whitening process of dividing the cross power spectrum $G_{y,x}$ by the auto power spectrum $G_{x,x}$ as discussed in the article by Roth or, in some applications, dividing the cross power spectrum $G_{y,x}$ by the square root of the product of auto power spectra $(G_{y,y}G_{x,x})^{1/2}$ as discussed by Carter et al. Thus the accuracy and ambiguity resolution which is required in a given application will determine the degree and type of whitening which is required in the application and consequently will determine the complexity of the apparatus which is to be used. In general, the measurement of the impulse response $h$ based upon the whitened cross power spectra $G_{y,x}/G_{x,x}$ or $G_{y,x}/(G_{y,y}G_{x,x})^{1/2}$ is a more complex measurement than is the measurement of the cross correlation $R_{y,x}$ based upon the unwhitened cross power spectrum $G_{y,x}$ and consequently the apparatus of the matched clutter filter is more complex than that for the matched filter.

Once the selection of the whitening process is made in a given application the problem reduces to the implementation of apparatus having the highest possible speed and lowest possible weight, size, power consumption and cost. In general the transforms represented by equations (8) present an excessive computational load for a general purpose computer and a heavy load even for a digital computer structured for signal processing. For example, a straightforward linear transformation in a computer that takes a sequence of N data points into a sequence of N transform points may be regarded as a multiplication by a vector $N^2$ matrix. A direct implementation therefore requires $N^2$ words of storage and $N^2$ multipliers (simultaneous multiplications). However it is well known that in a correlation or convolution integral one can take advantage of the fast Fourier transform algorithm (FFT) which requires only about $Nlog_2N$ calculations instead of $N^2$ and for N large the time and storage space saved becomes quite significant. This can all be seen in the article by Stockham "High Speed Convolution and Correlation" appearing in the 1966 Spring Joint Computer Conference AFIPS Conf Proc vol 28, Washington, DC; Spartan pp 229–233.

Matched filters, correlators, and convolvers for performing the computations of matched filtering, cross and auto correlation, and convolution are known in the art which require only 2N words of storage and N multipliers. These make their computations in the time domain and are discussed in a number of publications including the paper by Whitehouse et al "High Speed Serial Access Linear Transform Implementations" Naval Undersea Center, San Diego, CA 92132 January 1973. In general apparatus fall into two broad categories; those employing acoustic means and non-acoustic means. Included in the former category are sonic, magnetostrictive, acoustic surface waves, and opto-acoustic filters while the latter category comprises charge coupled devices (CCD), binary shift registers (BSR), and random access memories (RAM). Acoustic filters have been described in the paper by Squire et al "Linear Signal Processing and Ultrasonic Transversal Filters" appearing in the November 1969 issue of IEEE Transactions on Microwave Theory and Techniques and in the paper by Holland and Claiborne "Practical Acoustic Wave Devices" appearing in the May 1974 issue of IEEE Proceedings while non-acoustic filters have been described in the paper by Byram et al "Signal Processing Device Technology" appearing in the Proceedings of the NATO Advanced Study Institute on Signal Processing held at the University of Technology, Loughborough, U.K. on Aug. 21 through Sept. 1, 1972, and in the papers by Kosonocky and Buss et al appearing in Technical Session 2 "Introduction to Charge Coupled Devices" 1974 Wescon, Los Angeles Sept. 10 through 13, 1974. In particular, digital implementations for matched filters, correlators, and convolvers have been disclosed in my copending applications Ser. Nos. 595,240 filed July 11, 1975 (a continuation-in-part of 450,606 filed Mar. 13, 1974, now abandoned and 479,872 filed June 17, 1974 now U.S. Pat. No. 3,950,635.

Fourier analyzers for performing the computations of the Fourier transform and inverse Fourier transforms are well known in the present art. These make their computations generally in the frequency domain and employ all-software or all-hardware logic to make the computations using the Fast Fourier Transform (FFT). While software devices using FFT offer a decided advantage over a non FFT computer in that they require $Nlog_2N$ words of storage and $Nlog_2N$ multipliers they do not possess the simplicity of their counterpart time domain computers and special purpose FFT hardware. FFT special purpose hardware are known in the present art having only 2N words of storage and N multipliers and these have been described in the article by Bergland "FFT Hardware Implementations — an Overview" appearing in the June 1969 issue of IEEE Transactions on Audio and Electroacoustics and in the article by Groginsky and Works "A Pipeline FFT" appearing in the November 1970 IEEE Transactions on Computers. Hardwired time compression Fourier analyzers are also known in the present art and these are described in Report TB-11 "Real Time — Time Compression Spectrum Analysis" 1971 Signal Analysis Corporation, Hauppauge, NY 11787, and in Monograph No. 3 "Real Time Signal Processing in the Frequency Domain" 1973 Federal Scientific Corporation, New York, NY 10027. Fourier analyzers are compared in Planning Report No. 23 "Comparison of FFT Analyzers" Revised April 1973 Federal Scientific Corporation. In particular, a digital implementation for a FFT processor has been disclosed in my copending application Ser. No. 530,748 filed Nov. 4, 1974 now U.S. Pat. No. 3,965,342.

From the foregoing it is clear that while the present art provides high speed efficient method and apparatus for implementing matched filters it falls short of providing such method and apparatus for implementing matched clutter filters. The situation is particularly frustrating in signal processing applications in which it is desired to obtain the impulse response $h$, transfer function H, and coherence function $\gamma^2$ for a pair of complex signals. By making most computations in error sensitive apparatus, the present art is burdened by low computational speeds and apparatus having large weight, size, power consumption, and cost. To conserve investments in applications for which speed can be traded the present art achieves savings by making computations off-line, i.e., not in real time (storing signals and using conventional computers).

From this discussion it is clear that in the past the implementation of a system for the measurement of the impulse response $h$, transfer function H, and coherence function $\gamma^2$ has been accomplished primarily using error sensitive devices and for all practical purposes has not been made commercially available to any great extent being confined to the laboratory and to certain industrial and governmental applications where performance is required at any cost.

It is the purpose of the present invention to produce a matched clutter filter for the measurement of the impulse response $h$, transfer function H, and coherence function $\gamma^2$ which operates in real time and in many applications betters the efficiency and economy of apparatus used in the present art.

SUMMARY OF THE INVENTION

This invention provides apparatus and method for the implementation of a recursive filter and more particularly for the implementation of a matched clutter filter.

The general purpose of the invention is to provide new and improved recursive filters. Utilizing the system of the present invention the desired output of a recursive filter may be obtained efficiently and economically in real time.

A particular objective of the present invention is to provide high speed apparatus for the measurement of the impulse response $h$ and its associated transfer function H and coherence function $\gamma^2$ of a pair of signals $y$ and $x$, or, alternatively, for the measurement of the impulse coherence $\Gamma$ and its associated coherence function $\gamma^2$ and transfer function H of a pair of signals $y$ and $x$.

Briefly, the present invention provides an efficient and economic recursive filter for use in real time. The system is based on the use of the convolution integral or fast convolution and may be implemented as a serial, cascade, parallel, or array processor. The design is conventional up to a point, the important and distinguishing feature being the selection of non-recurring means for processing of poles. While the design of a conventional recursive filter requires a recurring and therefore complex architecture the system of the present invention uses the simple means of a read-only memory (ROM) or programmable read-only memory (PROM) and in this manner significantly reducing the software and/or hardware required. Typically, in one embodiment which uses the fast convolution the filter transfer function $H_r$ is obtained at the output of a divider in the form of a ROM or PROM and is multiplied with the frequency spectrum $S_y$ in a multiplier to obtain the transfer function H after which the impulse response $h$ is obtained using an inverse Fourier analyzer. In another embodiment using the convolution integral the filter impulse response $h_r$ is first obtained from the transfer function $H_r$, itself obtained in a divider using a ROM or PROM, and the filter output $h$ is then obtained by computing the convolution $h = yh_r$ in a convolver.

In view of the foregoing description, the speed of operation, simplicity of construction, and minimal power consumption and cost of a recursive and matched clutter filter will become apparent. As a result, a recursive and matched clutter filter in accordance with the present invention may be produced which is fast, simple, efficient, accurate, and economically suited for use and mass consumption in a wide variety of applications, for example in the accurate determination of the frequency response of a system under test, in the unambiguous determination of closely spaced overlapping signals in a radar, sonar, communication system and, in the fast determination of the causality between two signals. Accordingly, the present invention may result in the significant increase of speed of operation and decrease in the weight, size, power consumption, and costs of radars, sonars, communication systems, and measurement and test equipment.

DESCRIPTION OF THE PREFERRED EMBODIMENTS

Figure 1A:
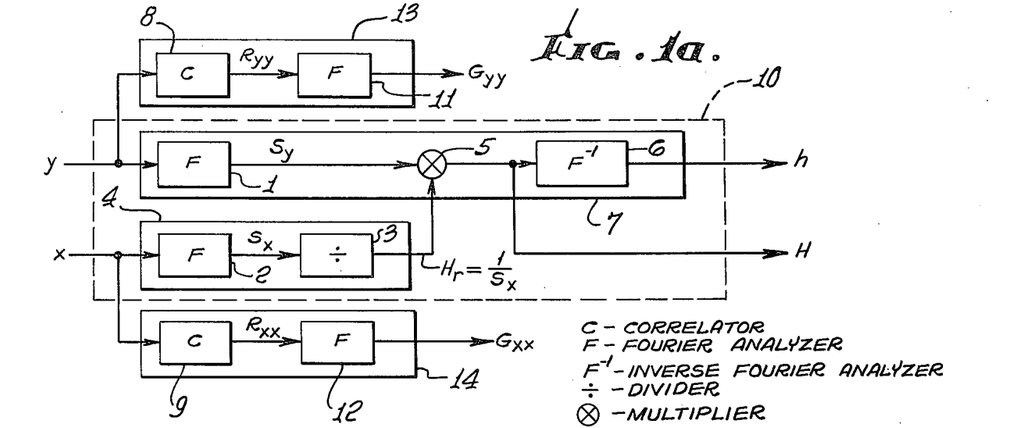
FIGS. 1A, 1B, 1C are block diagrams of systems of the present invention based on fast convolution.
Figure 1B:
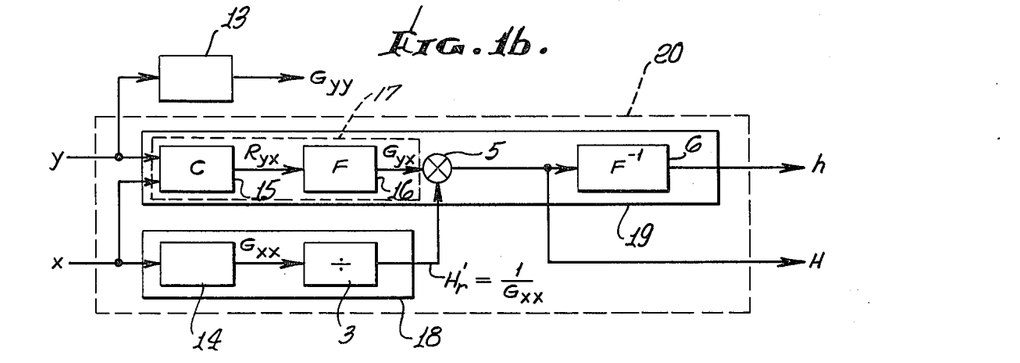
Figure 1C:
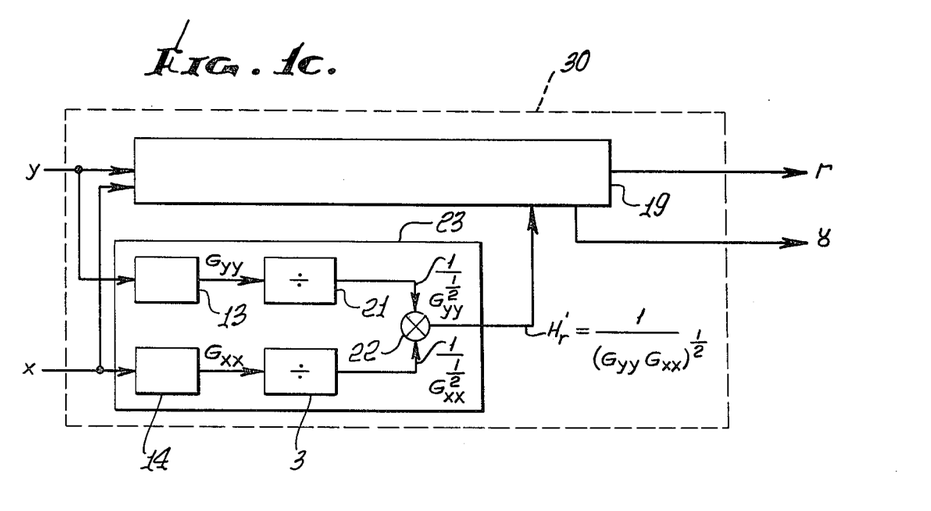

FIGS. 1A, 1B, and 1C are block diagrams of systems of the present invention based on the fast convolution. FIGS. 1A and 1B measure the transfer function H of two signals $y$ and $x$ appearing at their inputs. The measured transfer function H may be used to compute the impulse response $h$ and coherence function $\gamma^2$ as desired. FIG. 1C measures the coherence function $\gamma^2$ of two signals $y$ and $x$ appearing at its input. The measured coherence function $\gamma^2$ may be used to compute the impulse coherence $\Gamma$ and transfer function H as desired.

In FIG. 1A signals $y$ and $x$ are inputed to first and second Fourier analyzers 1 and 2 in recursive filter 10 and these compute the frequency spectra $S_y$ and $S_x$ respectively in accordance with equations (1). Frequency spectrum $S_x$ is inputted to a divider 3 which computes the transfer function $H_r = 1/S_x$ in accordance with equations (12). Fourier analyzer 2 and divider 3 form first means 4 in recursive filter 10. Frequency spectrum $S_y$ is inputted to a multiplier 5 which also receives input the transfer function $H_r$ from divider 3 and provides at its output the transfer function H in accordance with equations (12). Transfer function H may be inputted to an inverse Fourier analyzer 6 to obtain the impulse response $h$ in accordance with equations (12). Fourier analyzer 1, multiplier 5, and inverse Fourier analyzer 6 form second means 7 in recursive filter 10. Power spectra $G_{yy}$ and $G_{xx}$ may be obtained by applying signals $y$ and $x$ to correlators 8 and 9 which compute auto correlations $R_{yy}$ and $R_{xx}$ in accordance with equations (3). Auto correlations $R_{yy}$ and $R_{xx}$ are inputted to Fourier analyzers 11 and 12 which compute auto power spectra $G_{yy}$ and $G_{xx}$ in accordance with equations (3). Correlator 8 and Fourier analyzer 11 form third means 13 for computing auto power spectrum $G_{yy}$. Correlator 9 and Fourier analyzer 12 form fouth means 14 for computing auto power spectrum $G_{xx}$.

In FIG. 1B signals $y$ and $x$ are inputted to correlator 15 in recursive filter 20 which then computes the cross correlation $R_{yx}$ in accordance with equations (3). Cross correlation $R_{yx}$ is inputted to Fourier analyzer 16 which provides as output the cross power spectrum $G_{yx}$ in accordance with equations (3). Correlator 15 and Fourier analyzer 16 form fifth means 17 for computing cross power spectrum $G_{yx}$. Signal $x$ is inputted to fourth means 14 for computing auto power spectrum $G_{xx}$. Auto power spectrum $G_{xx}$ is inputted to a divider 3 which computes the transfer function $H_r' = 1/G_{xx}$ in accordance with equations (12). Fourth means 14 for computing auto power spectrum $G_{xx}$ and divider 3 form first means 18 in recursive filter 20. Cross power spectrum $G_{yx}$ is inputted to a multiplier 5 which also receives input the transfer function $H_r'$ from divider 3 and provides at its output the transfer function $H$ in accordance with equations (12). The transfer function $H$ may be inputted to an inverse Fourier analyzer 6 to obtain the impulse response $h$ in accordance with equations (12). Fifth means 17 for computing cross power spectrum $G_{yx}$, multiplier 5, and inverse Fourier analyzer 6 form second means 19 in recursive filter 20. Third means 13 may be used for computing auto power spectrum $G_{yy}$.

In FIG. 1C signals $y$ and $x$ are inputted to third and fourth means 13 and 14 in recursive filter 30 and these compute auto power spectra $G_{yy}$ and $G_{xx}$ in accordance with equations (3). Auto power spectra $G_{yy}$ and $G_{xx}$ are inputted to dividers 21 and 3 which compute the functions $1/G_{yy}^{1/2}$ and $1/G_{xx}^{1/2}$. Functions $1/G_{yy}^{1/2}$ and $1/G_{xx}^{1/2}$ are inputted to a multiplier 22 which computes the transfer function $H_4' = 1/(G_{yy}G_{xx})^{1/2}$ in accordance with equations (13). Third and fourth means 13 and 14 for computing auto power spectra $G_{yy}$ and $G_{xx}$, dividers 21 and 3, and multiplier 22 form first means 23 in recursive filter 30. Signals $y$ and $x$ are also inputted to a second means 19 which also receives the transfer function $H_r'$ from multiplier 22 and provides at its output the coherence function $\gamma$ and impulse coherence $\Gamma$ as desired and in accordance with equations (13).

Figure 2A:
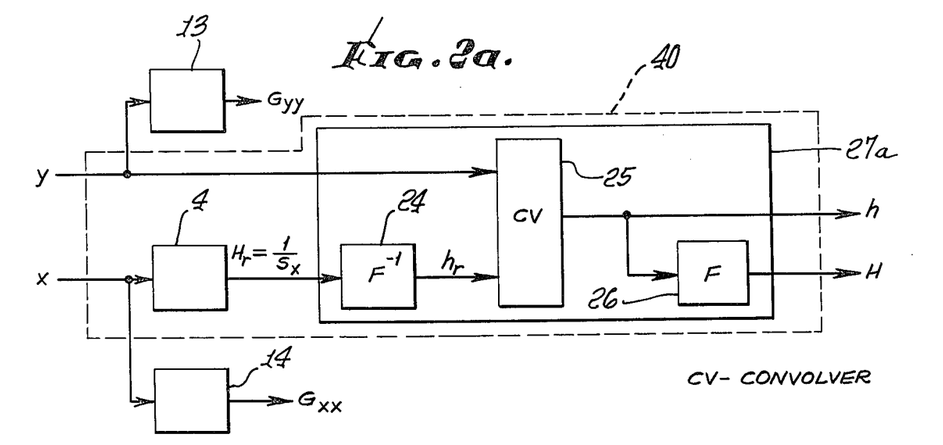
FIGS. 2A, 2B, 2C are block diagrams of systems of the present invention based on the convolution integral.
Figure 2B:
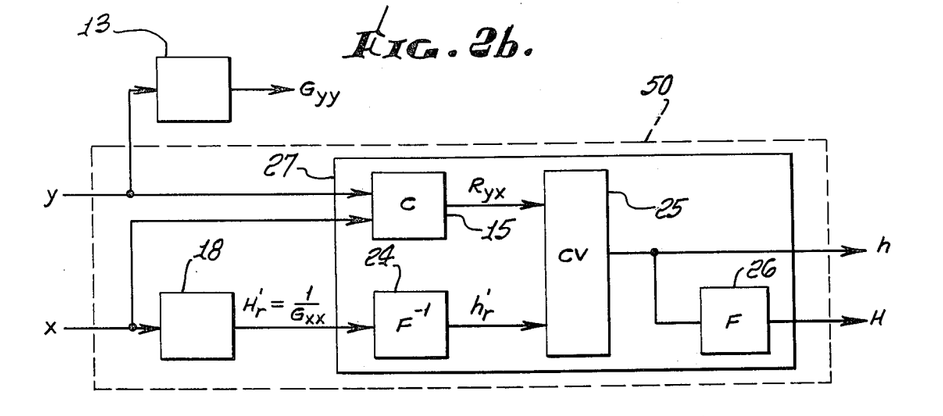
Figure 2C:
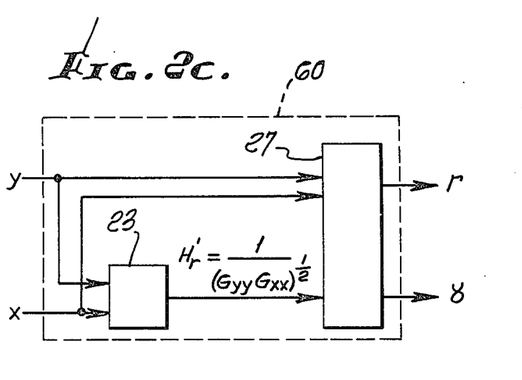

FIGS. 2A, 2B, and 2C are block diagrams of systems of the present invention based on the convolution integral. FIGS. 2A and 2B measure the impulse response $h$ of two signals $y$ and $x$ appearing at their inputs. The impulse response $h$ may be used to compute the transfer function $H$ and coherence function $\gamma^2$ as desired. FIG. 2C measures the impulse coherence $\Gamma$ of two signals $y$ and $x$ appearing at its input. The measured impulse coherence $\Gamma$ may be used to compute the coherence function $\gamma$ and transfer function $H$ as desired.

In FIG. 2A signal $x$ is inputted to first means 4 in recursive filter 20 and this computes the transfer function $H_r = 1/S_x$ in accordance with equations (12). Transfer function $H_r$ is inputted to an inverse Fourier analyzer 24 which computes the impulse response $h_r$ in accordance with equations (9). Signal $y$ is inputted to a convolver 25 which also receives input the impulse response $h_r$ from inverse Fourier analyzer 24 and provides at its output the impulse response $h$ in accordance with the first of equations (8). The impulse response $h$ may be inputted to a Fourier analyzer 26 to obtain the transfer function $H = F\{h\}$. Inverse Fourier analyzer 24, convolver 25, and Fourier analyzer 26 form second means 27a in recursive filter 40. Third and fourth means 13 and 14 may be used for computing auto power spectra $G_{yy}$ and $G_{xx}$.

In FIG. 2B signal $x$ is inputted to first means 18 in recursive filter 50 and this computes the transfer function $H_r' = 1/G_{xx}$ in accordance with equations (12). Transfer function $H_r'$ is inputted to an inverse Fourier analyzer 24 which computes the impulse response $h_r'$ in accordance with equations (9). Signals $y$ and $x$ are inputted to a correlator 15 which computes the cross correlation $R_{yx}$ in accordance with equations (3). Cross correlation $R_{yx}$ is inputted to a convolver 25 which also receives input the impulse response $h_r'$ from inverse Fourier analyzer 24 and provides at its output the impulse response $h$ in accordance with the first of equations (8). The impulse response $h$ may be inputted to a Fourier analyzer 26 to obtain the transfer function $H = F\{h\}$. Inverse Fourier analyzer 24, correlator 15, convolver 25, and Fourier analyzer 26 form second means 27 in recursive filter 50. Third means 13 may be used to obtain the auto power spectrum $G_{yy}$.

In FIG. 2C signals $y$ annd $x$ are inputted to first means 23 in recursive filter 60 and this computes the transfer function $H_r^{40} = 1/(G_{yy}G_{xx})$ in accordance with equations (13). Signals $y$ and $x$ are also inputted to second means 27 in recursive filter 60 which also receives input the transfer function $H_r^{40}$ from first means 23 and computes the impulse coherence $\Gamma$ and coherence function $\gamma$ in accordance with equations (13).

Figure 3:
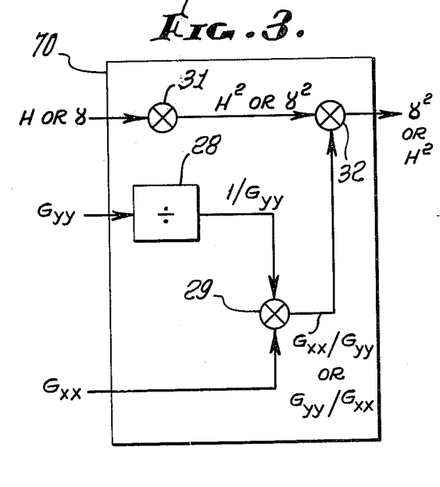
FIG. 3 is a block diagram of a multiplier-divider which may be used in connection with the systems of FIGS. 1 and 2.

FIG. 3 is a block diagram of a multiplier-divider 70 which may be used in connection with any one of the systems of FIGS. 1 and 2. In FIG. 3 the power spectra $G_{yy}$ and $G_{xx}$ and the transfer function $H$ or, alternatively, the coherence function $\gamma$, obtained from one of the systems of FIGS. 1 and 2, may be inputted to multiplier-divider 70 to obtain the coherence function $\gamma^2$ or transfer function $H^2$ in accordance with equation (6). Auto power $G_{yy}$ is inputted to a divider 28 which computes the function $1/G_{yy}$. Function $1/G_{yy}$ and auto power spectrum $G_{xx}$ are inputted to a multiplier 29 which computes the ratio $G_{xx}/G_{yy}$. Alternatively, putting driver 28 in the path of auto power spectrum $G_{xx}$ results in multiplier 29 computing the ratio $G_{yy}/G_{xx}$. Transfer function $H$ or coherence function $\gamma$ may be inputted to a multiplier (squarer) 31 which computes the square $H^2$ or $\gamma^2$. The square $H^2$ or $\gamma^2$ is inputted to multiplier 32 which also receives input the ratio $G_{xx}/G_{yy}$ or $G_{yy}/G_{xx}$ corresponding respectively to inputs $H^2$ or $\gamma^2$ and provides at its output the coherent function $\gamma^2$ or square transfer function $H^2$ as the case may be.

Figures 4A, 4B:
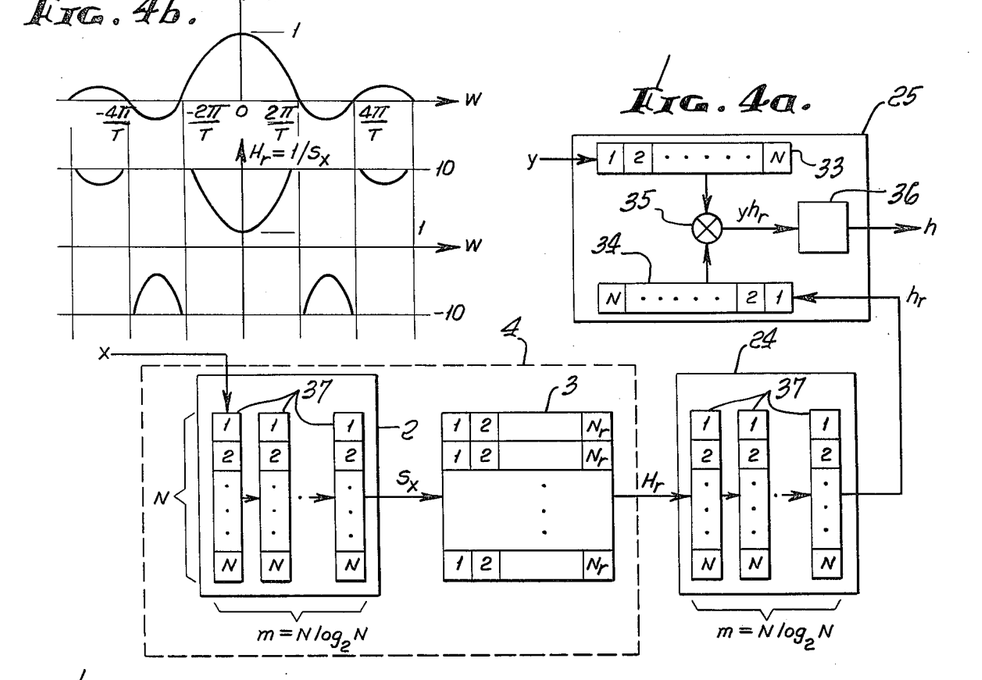
FIGS. 4A and 4C are more detailed block diagrams of the systems of FIGS. 2A and 2B.
FIGS. 4B and 4D show frequency and power spectra and corresponding implementations of transfer functions when signal $x$ is a pulse.
Figures 4C, 4D:
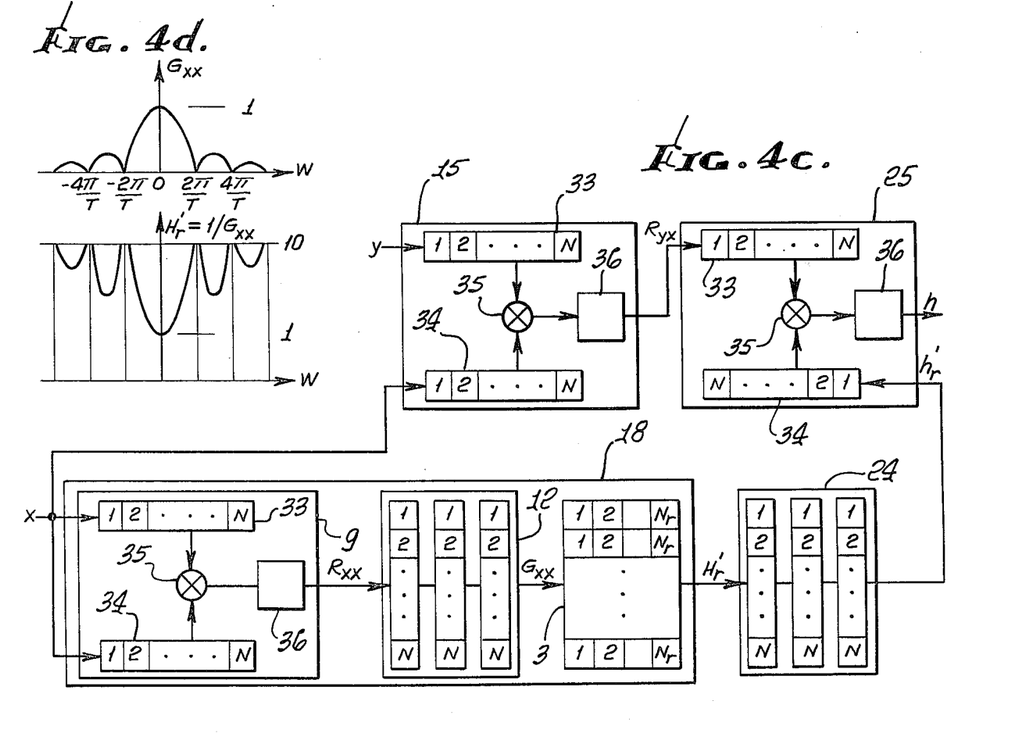

FIGS. 4A and 4C are more detailed block diagrams of the systems of FIGS. 2A and 2B and are given by way of example.

In FIG. 4A convolver 25 may comprise first and second N word delay units 33 and 34 in the form of analog or digital delay lines, shift registers, random access memories and so forth. Signal $y$ is loaded into delay unit 33 and signal $h_r$ is loaded into delay unit 34 in the manner shown. Thus signals $y$ and $x$ are made to travel in opposite directions and the cross convolution product $y(t)h_r(t-\tau)$ is obtained in multiplier 35 which may be in the form of a half-adder (exclusive OR), full adder and so forth. The cross convolution product $yh_r$ is inputted to low pass filter 36 whose output represents the impulse response $h$. The digital convolver which may be utilized has been disclosed in my copending applications Ser. Nos. 450,606 and 595,240. In particular, convolver 25 may include a DELTIC circuit or a time compressor for speeding up the computation of $h$, i.e., for obtaining N products $yh_r$ on each update or sample of signal $y$ inputted to delay unit 33. This can all be seen accomplished in detail in my copending applications Ser. Nos. 450,606 and 595,240. First means 4 may include a Fourier analyzer 2 in the form of a FFT processor having $m = N\log_2 N$ sections 37 each section having N words and, a divider 3 in one of a number of analog or digital forms, for example in the form of a read-only memory (ROM) or programmable read-only memory (PROM). A digital FFT processor which may be utilized has been disclosed in my copending application Ser. No. 520,748. Signal $x$ is inputted to the first section of FFT processor 2 and is processed in the m sections using the well known FFT algorithm, the output of FFT processor 2 representing the frequency spectrum $S_x$ in the usual scrambled order of frequency associated with this version of the algorithm. In particular, FFT processor 2 may include DELTIC circuits or time compressors for speeding up the computation of $S_x$, i.e., for obtaining N samples of the frequency spectrum $S_x$ on each update or sample of signal $x$ inputted to the first section of FFT processor 2. Frequency spectrum $S_x$ is inputted to divider 3 simultaneously in N channels or sweeping the N channels in time and divider 3 computes the transfer function $H_r = 1/S_x$. It should be recognized that divider 3 when implemented as a ROM or PROM provides a particularly simple and economic means for implementing the function of complex division and thus permitting the straightforward synthesis of a wide variety of recursive filters in accordance with the teachings of the present invention. Transfer function $H_r$ is inputted to inverse Fourier analyzer 24 also shown in the form of a FFT processor and whose output represents the impulse response $h_r$. A digital FFT processor which may be utilized has been disclosed in my copending application Ser. No. 520,748. In particular, FFT processor 24 may include a DELTIC circuit or time compressor for speeding up the computation of $h_r$, i.e., for obtaining N samples of the impulse response $h_r$ on each update of transfer function $H_r$ inputted to the first section of FFT processor 24. Since $H_r$ is updated at the same rate as $S_x$ and since $S_x$ is updated at the sampling rate of signal $x$, the impulse response $h_r$ itself updates at the signal $x$ rate. If signal $y$ updates at the same rate then, the impulse response $h_r$, i.e., the coefficients of the convolution integral, is made available to convolver 25 almost instantaneously (except for small delays in first means 4 and FFT processor 24). As a consequence, the matched clutter filter of FIG. 4A may operate in real time and affords the flexibility of real time programmability of the coefficients $h_r$. In general, once $h_r$ is obtained it can be stored in delay unit 34 until another set $h_r$ is needed and this capability extends from instantaneously to any time period gap between loadings of $h_r$ as desired.

FIG. 4B shows the frequency spectrum $S_x$ and transfer function $H_r = 1/S_x$ for the particular case where signal $x$ is a pulse. As shown in the figure, $S_x$ assumes a sin $$\frac{\omega T}{2} / \frac{\omega T}{2}$$

shape where $\omega$ is the angular frequency and T is the pulse-width. If the maximum amplitude of the frequency spectrum is 1 then the minimum value of $H_r$ is 1. The zeros of $S_x$ and poles of $H_r$ appear at $\omega_n = 2\pi n/T$ where $n = 1, 2, \ldots$ In practice ROM 3 cannot be implemented accurately where poles occur. However, the poles of $H_r$ and zeros of $S_x$ occur at the same place so the error which is present for lack of simulation of the actual $H_r$ in divider 3 will cancel out as will be more fully explained later. Of course, at frequencies removed from the poles, any degree of accuracy can be obtained for implementing $H_r$ simply by increasing the word size $N_r$ in ROM 3. Of course N words each of size $N_r$ are needed in ROM 3. This is an important feature of the present invention since the conventional design of a filter with poles requires a substantial increase in the redundancy of filter elements and consequently the complexity and cost of the filter whether implemented in a general purpose computer or with special purpose hardware. In the system of the present invention, this has all been traded for a simple increase in the size of memory of ROM 3.

In FIG. 4C signals $R_{yx}$ and $h_r^{40}$ are inputted to a convolver 25, for example as described in connection with the discussion of FIG. 4A. The output of convolver 25 represents the impulse response $h$. Signals $y$ and $x$ are inputted to a cross correlator 15 whose output represents the cross correlation $R_{yx}$. Signal $x$ is inputted to an auto correlator 9 whose output represents the auto correlation $R_{xx}$. Correlators 15 and 9 may be identical in form with cross convolver 25 except that while in the former signals $y$ and $x$ shift with respect to each other the latter shifts signals in opposite directions. In particular, correlators 15 and 9 may include a DELTIC circuit or time compressor for speeding up the outputs of these devices, i.e., for obtaining N output points on each update or sample of their input signals. This can all be seen accomplished in detail in my copending applications Ser. Nos. 450,606 now abandoned; 595,240; 435,681 now abandoned and 479,872, a continuation-in-part of 435,681, now U.S. Pat. No. 3,950,635. The auto correlation $R_{xx}$ is inputted to Fourier analyzer 12 which may be in the form of a FFT processor and which computes the auto power spectrum $G_{xx}$. A digital FFT processor which may be utilized has been disclosed in my copending application Ser. No. 520,748. Auto power spectrum $G_{xx}$ is inputted to a divider 3 in the form of a ROM which computes the transfer function $H_r^{40} = 1/G_{xx}$. The transfer function $H_r^{40}$ is inputted to an inverse Fourier analyzer 24 which also may be in the form of a FFT processor and which computes the impulse response $h_r^{40}$.

FIG. 4D shows the auto power spectrum $G_{xx}$ and transfer function $H_r^{40} = 1/G_{xx}$ for the particular case where signal $x$ is a pulse. As shown in the figure, $G_{xx}$ assumes a $$\left(\sin\frac{\omega T}{2} / \frac{\omega T}{2}\right)^2$$

shape where $\omega$ is the angular frequency and T is the pulse width. If the maximum amplitude of the auto power spectrum $G_{xx}$ is 1 then the minimum value of of $H_r'$ is 1. The zeros of $G_{xx}$ and poles of $H_r'$ occur at $\omega_n = 2\pi n/T$ where $n = 1, 2, \ldots$ As discussed previously, the zeroes of $G_{xx}$ and poles of $H_r'$ will cancel while any degree of accuracy in implementing $H_r'$ can be obtained simply by increasing the word size of ROM 3.

As example of the efficiency of the present invention, consider the efficiency of the two systems in FIGS. 4A and 4C. Correlators 15 and 9, and convolver 25 each require 2N words of storage, FFT processors 12 and 24 each require $N\log_2 N$ words of storage, and ROM 3 requires $NN_r$ words of storage. As a consequence, the totals required for the two systems are $N(2 + \log_2 N + N_r)$ and $N(6 + \log_2 N + N_r)$ which for N large approaches $2N\log_2 N$. This compares with the $M > 2N\log_2 N$ efficiency of conventional systems in the present art.

As example of the accuracy of the present invention consider, in a first approximation, the error $E_{y_o}$ in a filter as may be obtained directly from equation (7)

$$E_{y_o} = E_y H_r + E_r S_y + E_a = E_{y,r} H_r' + E_r' G_{y,r} + E_a' \qquad (16)$$

where $E_y$, $E_r$, $E_a$ and $E_{y,r}$, $E_r'$, $E_a'$ are the signal quantization, transfer function, and arithmetic quantization errors respectively in each type system implemented by transfer functions $H_r$ and $H_r'$ respectively. It is important to recognize that while in a non-recursive (zeros only) filter and transfer functions $H_r$ and $H_r'$ are bounded in amplitude these become unbounded in a recursive (zeroes and poles) filter and both $H_r$ and $H_r'$ and their errors $E_r$ and $E_r'$ therefore become infinite. As a consequence the recursive filter cannot be successfully implemented unless some way is found to reduce the component errors $E_y$, $E_r$, $E_a$ or $E_{y,r}$, $E_r'$, $E_a'$. This can all be seen in the article by Liu "Effect of Finite Word Length on the Accuracy of Digital Filters — A Review" appearing in the November 1971 issue of IEEE Transactions on Circuit Theory. Thus while the present recursive filter art has the potential it falls short of providing error-free filters especially when the number of poles in the filter is large. The consequence of this failure in the present art to manage the error problem has been the general unavailability of accurate, efficient, and economic filters in a large number of applications. The system of the present invention on the other hand overcomes this serious limitation of the present invention filter art by requiring that the recursive filter by implemented as a matched clutter filter. This can be best understood by considering equation (16). It can be seen in this equation that the total error $E_y$ goes to infinity when $H_r$, $E_r$ or $H_r'$, $E_r'$ go to infinity. The present invention postulates that the error $E_y$ can be minimized as $H_r$, $E_r$ or $H_r'$, $E_r'$ go to infinity if $S_y$, $E_y$ or $G_{y,r}$, $E_{y,r}$ go to zero and this means that $E_{y_o}$ reduces to the finite error $E_a$ or $E_a'$. But this teaching is precisely the case for the matched clutter filter. This then is the essence of the present invention, i.e., to physically implement the recursive filter as a matched clutter filter. Provided this is done the recursive filter can be realized directly using the convolution integral or using the DFT usually with FFT.

In general, correlators take the form of a cross correlator (signal y different from signal x) or an auto correlator (signal y equals signal x). Conventional correlators 8, 9, and 15 may be implemented in analog, digital, or hybrid forms, for example as suggested in the references by Whitehouse et al., Holland and Claiborne, Byram et al., Kosonocky, Buss et al., and in my copending applications Ser. Nos. 435,681 and 479,872. Conventional correlators 8, 9, and 15 of course are the equivalent of matched filters. It will be recognized by those in the art that conventional correlators, 8, 9 and 15 while generally implementable having 2N words of storage and N multipliers, the actual implementation in certain applications may result in additional simplifications. For example, a correlator can be implemented having only a single multiplier for reading out the contents of storage in time sequence. Also, the correlator when used as a fixed matched filter results in simplifications of the hardware associated with processing signal x by virtue of the fact that in a fixed filter signal x is presumed to be known a priori and therefore its auto correlation $R_{r,r}$ and auto power spectrum $G_{r,r}$ are also known and no need exists therefore to compute these functions; it is only necessary to "code" signal x into the hardware.

Conventional convolver 25 may be implemented in analog, digital, or hybrid forms, for example as suggested in the article by Kino and Shaw "Signal Processing in Acoustic Wave Devices" appearing in the August, 1971 IEEE Spectrum, and in my copending applications Ser. No. 450,606 and 595,240.

It will be appreciated by those skilled in the art that the combination of Fourier analyzer 1 and multiplier 5 in FIG. 1a and fifth means 17 and multiplier 5 in FIG. 1b form a frequency domain convolver contrasting to the time domain convolver 25 of FIGS. 2a and 2b. In general, the circuit configuration for the frequency and time domain convolvers which can be used may assume any well known form, including a programmed digital computer or more specialized hardwired apparatus, for example the techniques described in Helms "Fast Fourier Transform Method of Computing Difference Equations and Simulating Filters" appearing in the June, 1967 issue of IEEE Trans. on Audio and Electroacoustics, and in the reference by Stockham.

Dividers 3, 21, 28 may be implemented in analog, digital, or hybrid form. For example, analog multipliers and dividers are discussed in the article by Teeple "ICs are Multiplying" and in the article by Sheingold "Analog function modules are versatile components" both appearing in the May 1974 issue of Electronic Products Magazine. Digital multipliers and dividers which may be utilized are discussed in a variety of publications, for example in the book by Bartee "Digital Computer Fundamentals" Second edition McGraw-Hill 1966, in the two articles by Schomookler "Microelectronics opens the gate" and "Perform Binary Division Fast" appearing in the July 5 and July 19, 1966 issues of Electronic Design and in the two articles by Kostopoulos "Serial-Serial Multiplication" and "Serial-Parallel Multiplication" appearing in the April 1973 issue of Digital Design. In particular, dividers 3, 21, 28 may be implemented simply as ROMs or PROMs.

It will be appreciated by those skilled in the art that dividers 3, 21 and 28 can be implemented as an analog or digital divider and that the analog divider requires a digital-to-analog (D/A) converter for inputting digital information and an analog-to-digital (A/D) converter for outputting digital information. Analog and digital dividers are well known in the prior art, for example the Model 551 by Function Modules, Inc. is capable of operating as a multiplier, divider, or square root extractor as desired while digital dividers are shown at pages 5-32 through 5-44 in the book by Alfke and Larsen "The TTL Applications Handbook" Fairchild Semiconductor Corp., Mountain View, CA 94042. While the prior art dividers may be utilized, the preferred method of the invention is the use of a memory, for example a random access memory (RAM), read only memory (ROM), or programmable read only memory (PROM). Thus, divider 3 in FIG. 4a can be implemented as a parallel bank of ROMs each having $\log_2 N_r$ address lines with $N_r$ representing the digital amplitude of input frequency spectrum $S_r$ from Fourier analyzer 2 and having $\log_2 N_r$ outputs with $N_r$ also representing, therefore, the digital amplitude of frequency spectrum $H_r$ being provided to inverse Fourier analyzer 24. In this manner, the N frequencies of input frequency spectrum $S_r$ from Fourier analyzer 2 are converted to N corresponding frequencies of output frequency spectrum $H_r$ being provided to inverse Fourier analyzer 24. The corresponding between input and output frequency spectra of divider 3 can be seen by referring to FIG. 4b which indicates that the output frequency spectrum $H_r$ is definable at each of the N frequencies chosen to represent the input frequency spectrum $S_r$. Accordingly, each channel of divider 3, whether implemented as a prior art divider or as a memory, computes $H_r = 1/S_r$ so that the N inputs representing the input frequency spectrum $S_r$ are converted to N outputs representing the frequency spectrum $H_r$. Thus, a N word $x$ $N_r$ bit Fourier analyzer 2 would require a divider having N ROMs in parallel, each ROM having $N_r$ words by $N_r$ bits. The $N_r$ lines from each of the N channels (frequencies) of Fourier analyzer 2 would be connected respectively to the address inputs of each of the N ROMS in divider 3. The N word by $N_r$ bit outputs of divider 3 are then connected to the N channels (frequencies) of inverse Fourier analyzer 24.

It will be further appreciated by those skilled in the art that the foregoing specification by way of example of N ROMs in parallel comprising divider 3 is indicated when the N divisions of frequency spectrum $S_r$ are carried out in parallel, i.e., simultaneously, and that only one ROM is required when the N divisions are carried out in serial time. Moreover, addressing a RAM, ROM, or PROM on $N_r$ address lines with $N_r$ representing the binary digital amplitude of a general signal S, can be utilized to obtain $N_r$ outputs representing any desired function of the signal, for example the divisions 1/S or 1/S as desired, simply by programming the memory to provide the desired output function when the function S appears as an address to the memory. In the system of the present invention divider 3 provides N distinct sample $H_r$ each corresponding to the N applied samples $S_r$ according to the division $H_r = 1/S_r$. Likewise, dividers 3, 21, and 28 in FIGS. 1b, 1c, 2a, 2b, 2c, and 3 perform similar divisions.

Conventional Fourier analyzers 1, 2, 6, 11, 12, 16, 24, 26 may be implemented in analog, digital, or hybrid form, for example as suggested in the references by Gold and Rader, Rabiner and Radar, Report TB-11 Signal Analysis Corporation, Monograph No. 3 Federal Scientific Corporation and, in my copending application Ser. No. 520,748. In particular, it should be understood that while taking the power spectrum has been disclosed in terms of a correlator followed by a Fourier analyzer, for example inputting signal y to correlator 8 followed by Fourier analyzer 11 to obtain the auto power spectrum $G_{yy}$ in FIG. 1A, this can also be done using alternate means, for example see FIG. 11 in the paper by Buss et al. As a consequence wherein a correlator followed by a Fourier analyzer has been shown by way of example in FIGS. 1 and 2 for obtaining power spectra these means may be replaced by a single device. Thus while the present disclosure for obtaining power spectra is made using the FFT algorithm, the invention may be implemented equally well using the CZT algorithm. Of course, both the FFT and CZT algorithms are alternative approaches for performing the DFT. The particular form of Fourier analyzers 1, 2, 6, 11, 12, 16, 24, 26 is in no way critical for the purposes of this invention. Thus, any one of the FFT configurations described in the reference by Bergland may prove convenient in particular instances. Also, the particular configurations described in U.S. Pat. Nos. 3,544,775 issued Dec. 1, 1970 to Bergland et al.; 3,588,460 issued June 28, 1971 to Smith; and No. 3,517,173 issued June 23, 1970 to Gilmartin et al., are suitable for performing the required Fourier transformation.

It will be appreciated by those skilled in the art that implementing a parallel bank of clutter filters of the invention, in a manner reminiscent of a bank of doppler filters, is possible and provides a system for detecting waveforms having different bandwidths and time durations. Thus, while a single matched clutter filter for computing $h$ of signals $y$ and $x$ provides more accuracy over a matched filter for computing the correlation function $R_{yx}$ of signal $y$ and $x$, a bank of matched clutter filters likewise provides more accuracy over a bank of matched filters. Implementing, therefore, an electronic processor as a parallel bank of matched clutter filters of the invention provides a solution to the problem of electronically obtaining high quality two-dimensional images in a real time synthetic aperture.

From the foregoing it can be seen that the present invention implements the recursive filter as a matched clutter filter and in so doing increases the efficiency and accuracy for such devices. The invention therefore offers added benefits of high speed using efficient and economical apparatus in many applications, for example providing unambiguous and accurate determinations of $h$, H or $\Gamma$, $\gamma$ whose importance have been discussed in the reference by Roth and by Carter. These features are obtained using new and improved apparatus over the present art.

In many applications it is desirable to combine the central control afforded by a general purpose computer with the efficiency and economy provided by special purpose signal processing devices. Such applications might require operations which include matched clutter filtering for echo ranging, or for coherent communications systems, convolution to obtain high resolution between signals and recursive filtering for general linear transformations on data vectors. The recursive filter implemented as a matched clutter filter is a special purpose signal processing device which performs linear operations at rates in excess of the capabilities of large general purpose computers. Its applications include and are well suited for the detection, resolution, and identification of signals and the quantitative determination of their relationships and causality. Options for the implementation of recursive filters and matched clutter filters include both analog and digital means, their full potential being limited by the technical efficiency and economic availability of hardware. The present invention offers outstanding practical implementations and should find use in such sophisticated signal processing tasks as system identification, signal identification, bit synchronization, bit detection, error correction, coding, pulse compression, geological and earthquake signal analysis, medical signal analysis and, in such diverse system as radar, sonar, communications systems, electronic and medical test equipment, and so forth. In particular, the present invention provides, fast efficient, accurate, and economic means for the computation of the impulse response $h$, transfer function H, and coherence function $\gamma^2$ further extending the speed, efficiency, accuracy, and economic availability for such devices. As a consequence, the system of the present invention is expected to make dramatic increases in the speed of operation for such devices and corresponding reductions in the cost and complexity of accurately and unambiguously detecting and identifying signals, i.e., in the speedup of operation and lowering of weights, sizes, power consumption, and costs, of radars, sonars, communications systems, test equipment, and so forth.

Although a few configurations of a recursive filter implemented as a matched clutter filter have been described, it should be understood that the scope of the invention should not be considered to be limited by the particular embodiment of the invention shown by way of illustration but rather by the appendant claims.

I claim:

1. In a recursive (zeros and poles) filter implemented as a matched clutter filter having input signals $y$ and $x$, the improvements comprising:
   first means having input signal $x$ and providing at its output a signal representing the transfer function $H_r$ of said recursive filter; and
   second means having input the signal $y$ and signal $H_r$ from said first means and providing at its output at least one of the convolution signal $y_o = y^* h_r$ and its frequency spectrum $S_{y_o}$.

2. The system of claim 1 with
   means in the form of at least one of a ROM or PROM included in said first means for performing the function of a division.

3. The system of claim 1 wherein
   said second means includes an inverse Fourier analyzer having the frequency spectrum $S_y$ as input and providing the signal $y_o$ as output.

4. The system of claim 1 wherein
   said second means includes a Fourier analyzer having the signal $y_o$ as input and providing the frequency spectrum $S_{y_o}$ as output.

5. The system of claim 1 with
   means included in said first means having signal $x$ as input and providing the transfer function $H_r = 1/S_x$ as output.

6. The system of claim 5 with
   means included in said second means having signal $y$ and transfer function $H_r = 1/S_x$ as input and providing the frequency spectrum $S_{y_o} = H = S_y/S_x$ as output.

7. The system of claim 6 with
   means included in said second means having the transfer function H of signals $y$ and $x$ as input and providing the impulse response $h$ as output.

8. The system of claim 5 with
   means included in said second means having signal $y$ and transfer function $H_r = 1/S_x$ as input and providing the impulse response $y_o = h$ as output.

9. The system of claim 8 with
   means included in said second means having the impulse response $h$ as input and providing the transfer function H of signals $y$ and $x$ as output.

10. The system of claim 1 with
    means included in said first means having signal $x$ as input and providing the transfer function $H_r = 1/G_{xx}$ as output.

11. The system of claim 10 with
    means included in said second means having signal $y$ and transfer function $H_r = 1/G_{xx}$ as input and providing the frequency spectrum $S_{y_o} = H = G_{yx}/G_{xx}$ as output.

12. The system of claim 11 with
    means included in said second means having the transfer function H of signals $y$ and $x$ as input and providing the impulse response $h$ as output.

13. The system of claim 10 with
    means included in said second means having signal $y$ and transfer function $H_r = 1/G_{xx}$ is input and providing the impulse response $y_o = h$ as output.

14. The system of claim 13 with
    means included in said second means having the impulse response $h$ as input and providing the transfer function H of signals $y$ and $x$ as output.

15. The system of claim 1 with
    means included in said first means having signal $x$ as input and providing the transfer function $H_r = 1/(G_{yy}G_{xx})$ one-half as output.

16. The system of claim 15 with
    means included in said second means having signal $y$ and transfer function $H_r = 1/(G_{yy}G_{xx})$ one-half as input and providing the frequency spectrum $S_{y_o} = \gamma = G_{yx}/(G_{yy}G_{xx})$ one-half as output.

17. The system of claim 16 with
    means included in said second means having the coherence function $\gamma$ as input and providing the impulse coherence $\Gamma$ as output.

18. The system of claim 15 with
    means included in said second means having signal $y$ and transfer function $H_r = 1/(G_{yy}G_{xx})$ one-half as input and providing the impulse coherence $y_o = \Gamma$ as output.

19. The system of claim 18 with
    means included in said second means having the impulse coherence $\Gamma$ as input and providing the coherence function $\gamma$ as output.

20. The system of claim 1 wherein
    said first and said second means are implemented using special purpose hardware.

21. The system of claim 1 including:
    third means having input signal $y$ for computing auto power spectrum $G_{yy}$;
    fourth means having input signal $x$ for computing auto power spectrum $G_{xx}$; and
    means having as inputs, the output of said third and fourth means and at least one of the transfer function H of signals $y$ and $x$ and coherence function $\gamma$ of signals $y$ and $x$ from said second means for computing at least one of the coherence function $\gamma^2$ and transfer function $H^2$.

* * * * *